April 5, 1955 O. C. HALL 2,705,755
MIXER CIRCUIT
Filed Jan. 28, 1950
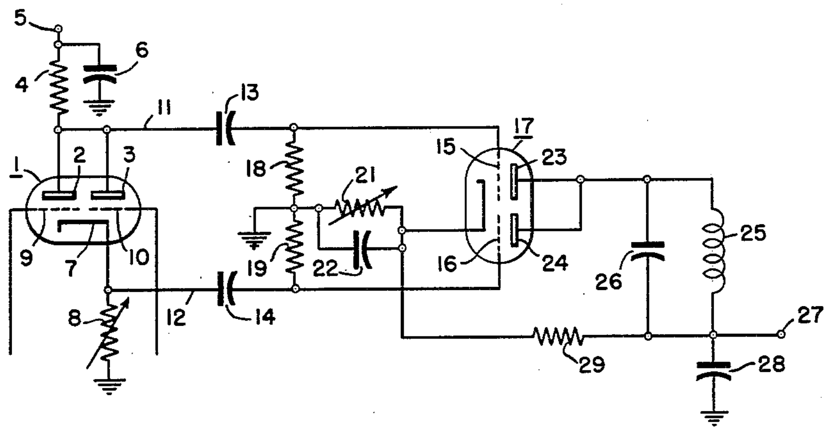
WITNESSES:
Edward Michaels
Raymond G. Brodahl
INVENTOR
Orville C. Hall.
BY
Hymen Diamond.
ATTORNEY United States Patent Office 2,705,755

Patented Apr. 5, 1955

2,705,755

MIXER CIRCUIT

Orville C. Hall, Baltimore, Md., assignor, by mesne assignments, to the United States of America as represented by the Secretary of the Navy Application January 28, 1950, Serial No. 141,057

1 Claim. (Cl. 250—36)

This invention relates generally to mixer circuits, and more particularly to mixer circuits for mixing frequencies to derive conversion products of desired orders, while substantially suppressing conversion products of undesired orders, as well as the original frequencies themselves and harmonics of the original frequencies, and conversion products of the harmonics.

In recent years synthesis type oscillation generating systems, for deriving a continuously variable frequency over a wide band, have come into relatively widespread use. A primary advantage of systems of this character is their ability to generate a wide band variable frequency with an accuracy and stability which is normally realized only in the case of fixed frequencies controlled by crystals. Synthesis systems in general depend upon the use of a fixed crystal controlled oscillator, from which multiples and sub-multiples of its frequency are selected and combined, and a highly stable variable low frequency oscillator, the output of which is combined with the signals derived from the crystal controlled oscillator. In systems of this character the choice of mixer tubes, and of mixer input frequencies, becomes of the highest importance.

In mixing two frequencies, harmonics of these frequencies are normally generated, and appear in the output of the mixing circuit. These harmonics are also subject to frequency conversion, providing various high order conversion products, which likewise appear in the output of the mixer circuit. Additionally, the original signals which are applied to the mixer circuit may appear in the output thereof. In designing a synthesis type signal generating system it is accordingly frequently found that very low order harmonics and/or very low order harmonic conversion terms will appear in the pass band of the output filter of the mixer circuit. These very low order components are of such amplitudes that they cannot be tolerated, and they must be avoided by proper selection of mixing frequencies, and by suitable design of the mixing circuit.

It has usually been considered necessary, in the prior art, to select frequencies for mixing such that nothing less than the seventh or eighth order components fall within the pass band of the mixer output filter, and further to operate the mixer with one of the input voltages at a much lower level than the other. In such case, it is usual to denominate the higher level signal a carrier, and the other signal a modulating voltage. By this procedure the harmonic terms can be held to approximately 60 or 70 db below the mixed signal. These conditions, however, greatly limit the choice of mixing frequencies and add to the filtering requirements since the carrier may be present in the output at a level above that of the conversion products.

I have accordingly invented, and disclose herein, a mixing system wherein suppression is provided to fifth order conversion components of 100 db. Lower order components are also reduced, with fourth order conversion terms down 60 to 70 db below the desired mixed signal. These results are accomplished while maintaining the level of the carrier frequency in the output circuit of the mixer below that of the desired side band frequency, which substantially reduces filter requirements. The system thus allows great freedom in selecting frequencies to be mixed.

Briefly described, and in accordance with the present invention, there is provided two paraphase inverters, or phase splitters, connected to have a common output circuit, and consisting of two grid controlled vacuum tubes, preferably triodes and in a single envelope, to the control electrodes of which are applied separately the signals to be mixed. The anodes of the triodes are tied together and connected in series with a single anode load resistor. The double triode may be provided with a single cathode, or if with two cathodes, the latter may be tied together, and a single cathode load resistor of variable magnitude is utilized. Leads deriving from the anodes and from the cathode system carry then the combined signals, in opposite phase on the two leads. The leads are connected respectively to two separate grids of a further double triode or equivalent, utilized as a mixing tube, and having its anodes tied together and a common cathode, or two cathodes electrically tied together. A single parallel tuned output circuit is connected in series with the anode circuits of the mixing tube, and is tuned to the desired conversion product, which may be either the sum or the difference of the two signals to be mixed. Means are provided for varying the bias on the further triodes, this bias preferably established at or adjacent to anode current cut-off. The bias varying means may be a cathode resistor for the mixing tube, connected in series with a further resistance to the positive anode supply terminal of the mixing tube power source.

The variable resistor in the cathode circuit of the first mentioned double triode, hereinafter called the paraphase inverter tube, may then be utilized for balancing the relative magnitudes of the carrier, or the higher amplitude signal of the two input signals which are desired to be mixed. The carrier, being applied to the control electrodes of the mixer tube in push-pull relation, and the anode load of the mixer tube being single ended, the carrier frequency normally balances out in the output circuit. Any carrier signal which appears in the output circuit is due then either to an unbalance of the separate sections of the mixer tube, or to a difference in amplitudes of the carrier signal as applied push-pull to the two separate control electrodes of the mixer tube. In either case, unbalance may be corrected for by varying the cathode resistor in the paraphase inverter tube.

It is known that triodes normally operate in accordance with a square law characteristic of anode current versus control grid potential, when the triodes are biased to anode current cut-off. For pure square law operation there will be generated in the output of the mixing system nothing higher than second order components of conversion, and since harmonic amplitudes at the output of the mixer will depend upon the specific value assigned to its bias, it is possible to achieve a fully balanced condition which provides maximum reduction of harmonics and consequently of harmonic conversion by adjustment of the cathode resistor of the mixer tube.

It has been found, in a practical system constructed in accordance with the above described principles, that with the mixer tube biased to plate current cut-off, and with the carrier signal ten times the amplitude of the modulation signal, the carrier frequency in the anode circuit of the mixer tube may be suppressed 6 to 10 db below the mixed signal, and the fifth order harmonic terms are down 80 to 85 db. By adjustment of the cathode resistor of the mixer circuit the harmonics may be reduced to over 100 db. down.

It is, accordingly, an object of the present invention to provide a novel mixer circuit for synthesis type signal generators.

It is a further object of the invention to provide a mixer signal which will provide no output signal upon failure of a tube of the system.

It is a further object of the invention to provide a mixer of the balanced type, having a single ended output circuit.

It is still another object of the invention to provide a mixer circuit having independent controls for balancing out one of the input signals, and for eliminating undesired harmonic frequencies.

The above and still further objects, features and advantages of the present invention will become apparent upon consideration of the following detailed description of a specific embodiment thereof, especially when taken in conjunction with the accompanying single figure of the drawing, which illustrates the embodiment in schematic circuit diagram.

Referring now more specifically to the drawing, the reference numeral 1 identifies a double triode vacuum tube having anodes 2 and 3, which are tied together and connected to one end of an anode load resistor 4, to the other end of which is connected a source of B+ voltage, identifiable in the drawing as a terminal 5. The latter may be by-passed to ground by a condenser 6 having low reactance at the frequencies of operation of the triode 1.

A single cathode 7 is provided in triode 1, which may represent schematically two cathodes electrically tied together, and which is connected to ground over a cathode resistor 8, which is adjustable, and which is un-bypassed. Separate control electrodes 9 and 10 are provided in operative association with the separate anodes 2 and 3, respectively, and to the control electrodes may be applied signals F*a* and F*b*, which are the signals it is desired to mix. For convenience, the signal F*a*, greater in amplitude than F*b*, may be considered to be a carrier, subject to modulation by signal F*b*. The signal F*a* may be operated at a much higher level than is the signal F*b*, the ratio of magnitudes being at least five, and preferably 10 or more.

The double triode 1 then operates as a paraphase inverter tube and provides a high impedance input for the signals F*a* and F*b*, there being present on the output leads 11 and 12, connected respectively to the anodes 2, 3, and the cathode 7, the signals F*a* and F*b*, together, in relatively opposite phase on the two leads. The resistor 8 may be adjusted for balance, and especially to control the relative amplitudes of the carrier signal F*a* on the output leads 11 and 12.

Connected in series with lines 11 and 12 are D.-C. blocking condensers 13 and 14, respectively. Equal resistors 18 and 19 are connected in series between the blocking condensers 13 and 14, and the point of connection between the resistors 18 and 19 is grounded. The circuit thus far described constitutes two paraphase inverters having a common output circuit.

The blocking condensers 13 and 14 are further connected, each to a respective control electrode 15, 16 of a double triode 17. The double triode 17 is provided with a single cathode 20, which is connected to ground through a variable resistor 21, which is by-passed, by means of a condenser 22, for A.-C.

The double triode 17 is further provided with two anodes 23 and 24, operatively associated respectively with control electrodes 15 and 16. The anodes 23 and 24 are tied together electrically, and to one end of a tuned anode output circuit comprising a parallel connected inductance 25 and capacitance 26, which may be tuned to a conversion product of the signals F*a* and F*b*, as for example, a frequency equal to *Fa*+*Fb*, or *Fa*−*Fb*. The other end of the tuned anode output circuit is connected to a source of anode voltage, represented as a terminal 27, which may be by-passed to ground for A.-C. by means of a condenser 28.

Connected between terminal 27 and cathode 25 is resistor 29, which together with resistor 21 provides a voltage divider for establishing the D.-C. bias of control electrodes 15 and 16.

This bias may establish at or adjacent anode cut-off, as one preferred mode of operation, but is adjustable by varying cathode resistor 21 to establish optimum operating conditions.

The double triode 1 operates then as a buffer and as a paraphase inverter tube and as part of a combining circuit for the signals *Fa*+*Fb*, and further may be utilized to compensate for unbalances in the circuit of double triode 17, to effect complete removal of carrier F*a* at the output of the system, as will become clear as the description proceeds.

The double triode 17 operates as a mixer tube, with push-pull input and single ended output. It is well known that a mixing system with a square law characteristic provides only second order conversion products. This condition may be closely approached by operating the double triode 17 at plate current cut-off, adjustment being effected by varying cathode resistor 21.

Since the control electrodes 15 and 16 are driven in push-pull while the anodes 23 and 24 are connected in parallel, and since the separate sections of the double triode 17 are caused to conduct in alternation in response to the relatively high amplitude carrier signals F*a*, at the frequency of F*a*, cancellation is effected of the out-of-phase components of both frequencies F*a* and F*b*. To the extent that the signal F*a*, as it appears on the control electrodes 15 and 16, fails to be of such relative amplitudes as to effect cancellation of carrier F*a* in the anode circuit of double triode 17, such cancellation may be enforced by varying resistance 8. If the triode sections of the triode 17 are matched precisely, and if the control circuits therefor are likewise matched, the amplitude of the carrier F*a* as it is applied to the lines 11 and 12 should be equal. The resistance 8 may be utilized to compensate for unbalances or failure of matching.

The resistance 21 may be adjusted until optimum removal of undesired harmonics is effected, since harmonic amplitude is a function of grid bias of double triode 17.

It has been found experimentally, that with double triode 17 biased to anode current cut-off, and with signal F*a* at ten times the amplitude of F*b*, the signal F*a* in the anode circuit of tube 17 can be suppressed 6 to 10 db below the mixed signal, and that fifth order harmonics are down 80 to 85 db. By further adjustment of resistor 21 it is found possible to reduce these harmonics to over 100 db down.

The circuit illustrated and hereinabove described, and which embodies my invention in a preferred form, possesses the following advantageous features. Dual section tubes are employed, with anodes in parallel, and with a single cathode. Obviously if double cathodes were employed, which is clearly within the scope of my invention, these would be connected in parallel. Thereby unbalance effects due to voltage variation and tube aging is reduced.

In the event of tube failure, by loss of emission, output signal is totally lost. This type of operation is advantageous over operation with separate tubes, wherein failure of a tube results in continued output, but with very high level of undesired frequencies.

The circuits are operated single ended throughout, which minimizes balancing problems.

The circuit is capable of reducing lower order harmonic and harmonic conversion products sufficiently to provide considerable freedom in choice of mixing frequencies, to produce a desired conversion product. Additionally, filtering requirements are reduced since harmonic reduction is achieved without increasing carrier level in the output circuit. Carrier level is reduced by adjustment of resistor 8, and harmonic level by adjusting resistor 21. The two adjustments are independent of one another.

While I have described one specific embodiment of my invention, it will be clear to those skilled in the pertinent art that variations in detail thereof may be resorted to without departing from the true scope of the invention, which is defined in the appended claim.

I claim as my invention:

In a signal mixer, a first vacuum tube having a first control electrode and a first anode, a second vacuum tube having a second control electrode and a second anode, a first source of first signal of first frequency, a second source of second signal of second and different frequency, means for connecting said first source to said first control electrode, means for connecting said second source to said second control electrode, a load resistor connected to said first and second anodes in parallel, at least one cathode for said first and second vacuum tubes, a cathode resistor connected in series with said at least one cathode, a pair of leads respectively connected to said first and second anodes in parallel and said at least one cathode, a mixer tube having a first control electrode and a first anode, a second control electrode and a second anode, and at least one cathode, a pair of equal resistances connected between said leads, the mid-point of said resistances grounded, a resistance connected from said last mentioned at least one cathode to said mid-point, a condenser shunting said resistance and having substantially zero reactance at said frequencies, means connecting said first and second control electrodes of said mixer tube each to one of said leads, a tuned output circuit connected in series with said anodes of said mixer tube, means connecting said anodes of said mixer tube in parallel, a positive anode voltage terminal connected to said anodes of said mixer tube through said tuned circuit, and a resistance connected from said terminal to said cathode, said tuned circuit tuned to a conversion product of said first frequency and said second and different frequency.

References Cited in the file of this patent

UNITED STATES PATENTS

| | | |
|---|---|---|
| 2,153,756 | Hunt | Apr. 11, 1939 |
| 2,470,240 | Crosby | May 17, 1949 |
| 2,458,760 | Anderson | Jan. 11, 1949 |
| 2,485,665 | Sheperd | Oct. 25, 1949 |
| 2,490,448 | Lott | Dec. 6, 1949 |
| 2,626,321 | Pan | Jan. 20, 1953 |

OTHER REFERENCES

Article; "Superheterodyne frequency conversion using phase-reversal modulation" by E. W. Herold, reprinted from Proc. IRE, and Waves and Electrons, April 1946, page 189.